US008127432B2

(12) United States Patent
Viscarra et al.

(10) Patent No.: US 8,127,432 B2
(45) Date of Patent: *Mar. 6, 2012

(54) PROCESS FOR FABRICATING AN ORIGAMI FORMED ANTENNA RADIATING STRUCTURE

(75) Inventors: Alberto F. Viscarra, Torrance, CA (US); Ethan S. Heinrich, San Pedro, CA (US); Melvin S. Campbell, Hawthorne, CA (US); David T. Winslow, Culver City, CA (US); Kevin C. Rolston, Westchester, CA (US); Rosalio S. Vidaurri, Los Angeles, CA (US)

(73) Assignee: Raytheon Company, Waltham, MA (US)

(*) Notice: Subject to any disclaimer, the term of this patent is extended or adjusted under 35 U.S.C. 154(b) by 54 days.

This patent is subject to a terminal disclaimer.

(21) Appl. No.: 12/620,544

(22) Filed: Nov. 17, 2009

(65) Prior Publication Data

US 2011/0113618 A1    May 19, 2011

(51) Int. Cl.
*H01P 11/00* (2006.01)
(52) U.S. Cl. ............. 29/600; 29/592.1; 29/830; 29/832; 156/292
(58) Field of Classification Search .............. 29/600, 29/601, 592.1, 25.41–25.42, 830–832; 343/700 MS, 343/770, 853; 340/572.1, 572.7; 156/49, 156/182, 292
See application file for complete search history.

(56) References Cited

U.S. PATENT DOCUMENTS

| 3,004,229 | A | 10/1961 | Stearns |
| 4,853,660 | A | 8/1989 | Schloemann |
| 5,262,590 | A | 11/1993 | Lia |
| 5,408,240 | A | 4/1995 | Battista et al. |
| 5,633,615 | A | 5/1997 | Quan |
| 6,018,326 | A | 1/2000 | Rudisill |
| 6,366,185 | B1 | 4/2002 | Keesey et al. |
| 6,696,163 | B2 | 2/2004 | Yang |
| 6,871,396 | B2 | 3/2005 | Sugaya et al. |
| 6,992,629 | B2 | 1/2006 | Kerner et al. |
| 7,298,331 | B2 | 11/2007 | Oberly |
| 7,523,548 | B2 | 4/2009 | Kataoka et al. |

(Continued)

FOREIGN PATENT DOCUMENTS

EP    2 230 775 A2    9/2010

(Continued)

OTHER PUBLICATIONS

Office Action mailed May 16, 2011 for U.S. Appl. No. 12/620,562, filed Nov. 17, 2009, Inventor Alberto F. Viscarra, et al. (11 pgs.).

(Continued)

*Primary Examiner* — Minh Trinh
(74) *Attorney, Agent, or Firm* — Christie, Parker & Hale, LLP

(57) ABSTRACT

A process for fabricating an origami formed antenna radiating structure is provided. In one embodiment, the invention relates to a process for precisely fabricating a radio frequency (RF) antenna structure, the process including providing a flexible circuit substrate, forming a plurality of parallel channels in the flexible circuit substrate in a first direction, mounting the flexible substrate to a precision die, pressing the flexible substrate into the precision die using an elastomeric material thereby sandwiching the flexible substrate between the elastomeric material and the precision die, and applying heat to the flexible substrate sandwiched between the elastomeric material and the precision die.

13 Claims, 7 Drawing Sheets

U.S. PATENT DOCUMENTS

| | | | |
|---|---|---|---|
| 7,525,498 B2 | 4/2009 | Quan et al. | |
| 8,043,464 B2 * | 10/2011 | Kim et al. | 156/292 |
| 2005/0264448 A1 | 12/2005 | Cox et al. | |
| 2006/0097945 A1 | 5/2006 | McCarville et al. | |
| 2007/0025044 A1 | 2/2007 | Golubovic et al. | |
| 2007/0131451 A1 | 6/2007 | Schmachtenberg, III et al. | |
| 2007/0139275 A1 | 6/2007 | Deaett et al. | |
| 2008/0088519 A1 | 4/2008 | Quan et al. | |
| 2009/0165296 A1 | 7/2009 | Carmi | |
| 2009/0231226 A1 | 9/2009 | Quan et al. | |
| 2011/0113618 A1 * | 5/2011 | Viscarra et al. | 29/600 |
| 2011/0113619 A1 * | 5/2011 | Viscarra et al. | 29/600 |
| 2011/0115578 A1 * | 5/2011 | Quan et al. | 333/238 |

FOREIGN PATENT DOCUMENTS

| | | |
|---|---|---|
| EP | 2 288 242 A1 | 2/2011 |
| FR | 2 871 336 A1 | 12/2005 |
| GB | 2 064 233 A | 6/1981 |
| JP | 8 051 279 A | 2/1996 |
| JP | 9 281 520 A | 10/1997 |
| WO | WO 2008/045349 A1 | 4/2008 |

OTHER PUBLICATIONS

Extended European Search Report for European Application No. 10251577.2, filed Sep. 10, 2010, Extended European Search Report dated Feb. 24, 2011 and mailed Mar. 4, 2011 (5 pgs.).

Extended European Search Report for European Application No. 10251576.4, filed Sep. 10, 2010, Extended European Search Report dated Feb. 24, 2011 and mailed Mar. 4, 2011 (6 pgs.).

Extended European Search Report for European Application No. 10251312.4, filed Jul. 23, 2010, Extended European Search Report dated Nov. 23, 2010 and mailed Dec. 10, 2010 (6 pgs.).

Extended search report for European Application No. 10251575.6-1248, Raytheon Company, European extended search report dated Jun. 8, 2011 and mailed Jun. 16, 2011 (8 pgs.).

* cited by examiner

PROCESS FOR FABRICATING AN ORIGAMI FORMED ANTENNA RADIATING STRUCTURE

STATEMENT REGARDING FEDERALLY SPONSORED RESEARCH

This invention disclosure is related to Government contract number FA8750-06-C-0048 awarded by the U.S. Air Force. The U.S. Government has certain rights in this invention.

BACKGROUND

The present invention relates generally to a process for fabricating an origami formed antenna radiating structure. More specifically, the invention relates to a process for precisely forming a radio frequency (RF) antenna structure using lightweight materials.

Next generation large area multifunction active arrays for applications such as space and airborne based antennas need to be lighter weight, lower cost and more conformal than what can be achieved with current active array architecture and multilayer active panel array development. These space and airborne antennas can be used for radar and communication systems, including platforms such as micro-satellites and stratospheric airships.

To address the need for lower cost and lightweight antennas, lightweight materials can be used to form antenna component structures. However, such lightweight materials can present new challenges for precisely forming antenna structures capable of providing sufficient performance in radar and communication systems.

SUMMARY OF THE INVENTION

Aspects of the invention relate to a process for fabricating an origami formed antenna radiating structure. In one embodiment, the invention relates to a process for precisely fabricating a radio frequency (RF) antenna structure, the process including providing a flexible circuit substrate, forming a plurality of parallel channels in the flexible circuit substrate in a first direction, mounting the flexible substrate to a precision die, pressing the flexible substrate into the precision die using an elastomeric material thereby sandwiching the flexible substrate between the elastomeric material and the precision die, and applying heat to the flexible substrate sandwiched between the elastomeric material and the precision die.

In another embodiment, the invention relates to a process for precisely fabricating a radio frequency (RF) antenna structure, the process including providing a flexible circuit substrate, forming a plurality of parallel channels in the flexible circuit substrate by heating an elongated section of the flexible substrate by dispensing heat from a plurality of holes in an elongated wedge, and pressing with the elongated wedge on the flexible substrate, in a direction normal to a surface of the flexible substrate, at a preselected position on the flexible substrate, wherein a channel shaped receptacle is positioned below the surface of the flexible substrate and aligned to substantially receive the flexible substrate and elongated wedge.

DETAILED DESCRIPTION OF THE INVENTION

Figure 1:
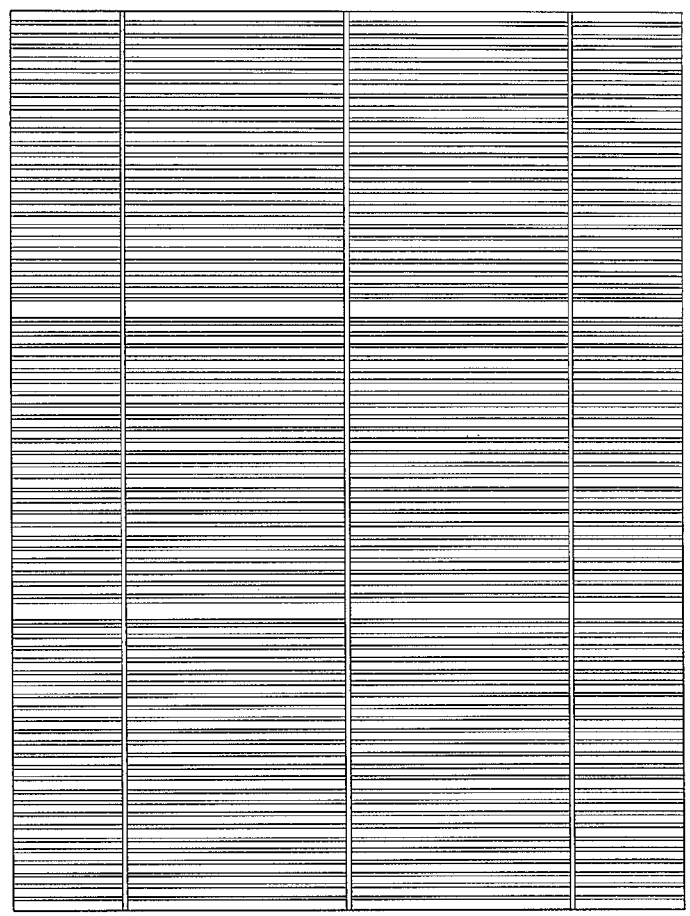
FIG. 1 is a top view of an RF antenna structure constructed of lightweight materials in accordance with one embodiment of the invention.

To achieve an ultra lightweight active array radar antenna it is helpful to integrate the structure of the radiating aperture with all the associated control circuitry and RF feeding circuitry. This is possible if a flexible circuit is formed in a three dimensional shape to create a series of long slot type radiating elements. These radiating elements can be created using a manufacturing method that involves a multi-step pneumatic actuated folding machine, along with a thermal setting process for creating precise repeatable folded circuit features for use as a level one RF feed in a radar antenna. In a number of embodiments, the level one RF feed includes integrated RF, digital and DC circuitry on a 3-D folded surface that also contains the launch surface for radiating energy. This folded or "origami" approach allows for a thin, flexible circuit to be folded into a radiating RF structure, while providing control signal routing for transmit/receive (T/R) chips that can be directly mounted to the folded structure. The result is a lightweight antenna that has good structural rigidity and a structure which can support direct mounting and soldering of electrical components.

Referring now to the drawings, embodiments of systems and methods for fabricating a level one RF feed of an RF antenna structure are illustrated. In one embodiment, the level one RF feed is formed using a process that starts with a flexible circuit substrate made of a lightweight material such as a liquid crystal polymer (LCP) material. In a number of embodiments, the LCP material has copper cladding on both surfaces of the substrate and copper circuitry etched on one or more of those surfaces. In other embodiments, the LCP material has aluminum plating. In the process, a plurality of elongated channels (e.g., long slot radiators) extending in a first direction can formed in the flexible substrate. The flexible substrate can be mounted to a precision tooled die. Pressure can be applied to the flexible substrate within the precision tooled die using a silicone backer plate. This entire assembly can be heated to allow the flexible substrate to fully and precisely conform to the shape of the precision die. A second substantially flat flexible substrate layer can be fused to the folded flexible substrate, thereby forming elongated tubular channels for emanating radar energy and providing structural support. Electronic components can be mounted to the surfaces of the flexible substrate layers (e.g., transmit/receive chips, etcetera).

In a number of embodiments, the elongated channels are formed in the flexible circuit substrate are formed using a two-stage press machine. The press machine can first apply downward pressure on the flexible substrate as it is secured within the machine, thereby creating a fold or elongated channel. The press machine can then apply lateral pressure to one of the channel walls, thereby further defining the channel. A number of evenly spaced channels can be formed across the flexible substrate. The formed flexible substrate can then be placed on a precision die and sandwiched by a silicone backer plate and retaining device. The entire sandwiched assembly can be heated at a preselected temperature for a preselected amount of time. In such case, the formed flexible substrate more accurately takes the shape of the precision die and silicone backer plate. The second substantially flat substrate is fused to one surface of the formed flexible substrate, and a precisely formed level one RF feed is fabricated.

In some embodiments, the elongated channels are formed using the two-stage press machine along with a heat supply apparatus that supplies heat from holes formed in the press machine before or during the downward pressure applied by the press machine. In such case, precise forming of the flexible substrate can be accomplished in absence of any subsequent thermal or die setting processes.

FIG. 1 is a top view of an RF antenna structure 10 constructed of lightweight materials in accordance with one embodiment of the invention. The RF antenna structure can act as or be a component of an antenna used in an active array radar system. In other embodiments, it may be used in other radar or communication systems.

Figure 2:
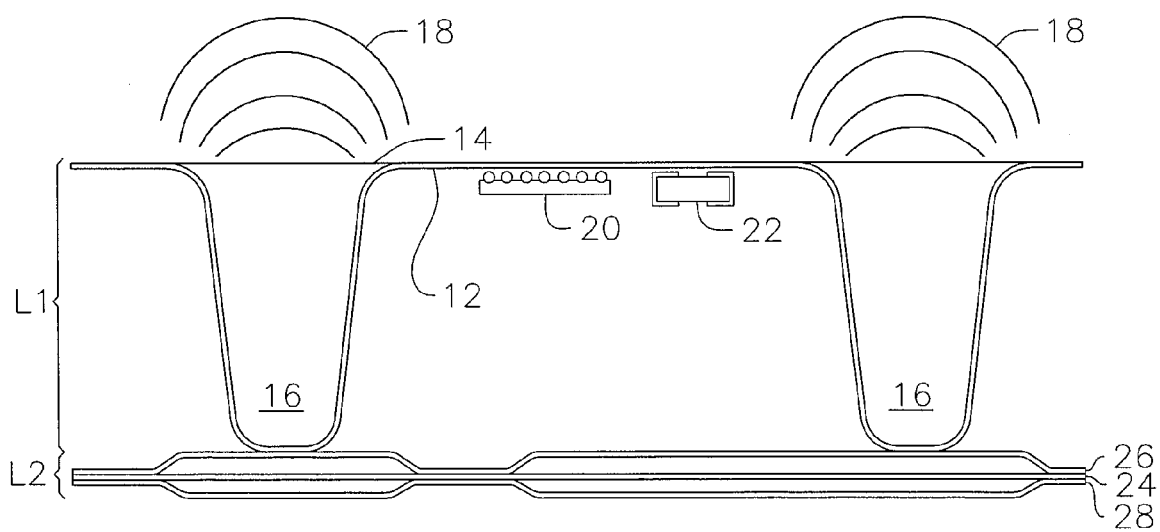
FIG. 2 is a cross sectional view of a portion of the RF antenna structure of FIG. 1 illustrating a level one RF feed assembly mounted to a level two RF feed assembly in accordance with one embodiment of the invention.

FIG. 2 is a cross sectional view of a portion of the RF antenna structure of FIG. 1 illustrating a level one RF feed assembly (L1 or Level 1) mounted to a level two RF feed assembly (L2 or Level 2) in accordance with one embodiment of the invention. The L1 assembly includes a folded flexible circuit layer 12 and a flat flexible circuit layer 14 where the folded areas of flexible layer 12 form elongated channels, or long slot radiators, 16 that radiate RF signals 18. Electrical components such as T/R chips 20 and capacitors 22 can be mounted to a surface of the folded flex circuit layer 12. In a number of embodiments, the flexible circuit layers are formed of a LCP material.

Below the L1 assembly or Level 1 feed is the Level 2 feed "sandwich" assembly (L2).

The Level 2 assembly consists of three layers of LCP; a flat center layer 24, and molded top 26 and bottom covers 28. The RF signals in the structure can support a suspended air-stripline transmission line design. In such case, the RF signals can travel within a cavity made by the top cover 26 and the bottom cover 28. The center layer 24 provides the RF signal trace routing. The top and bottom covers are plated on the inside of the cavity, providing the RF ground for the airline. As the topology of the 3-D antenna assembly varies across the assembly, use of different types of transmission lines on different sections of the assembly can maximize antenna performance. Therefore, transitions from one type of transmission line to another are useful for the three dimensional antenna structure. A description of an RF transition that can be used in conjunction with the L2 assembly is described co-pending U.S. patent application Ser. No. 12/620,467, entitled, "RF Transition with 3-Dimensional Molded Structure", the entire content of which is incorporated herein by reference.

The level two RF assembly of the RF antenna structure can be fabricated using flexible circuit substrates and techniques similar to those used to form the level one RF feed assembly. A process for fabricating a level two RF assembly for an RF antenna structure is described in co-pending U.S. patent application Ser. No. 12/620,562, entitled "Process for Fabricating A Three Dimensional Molded Feed Structure", the entire content of which is incorporated herein by reference. A novel method for bonding the lightweight level one and level two RF feeds using a number of adhesives and various heating and curing techniques is described in co-pending U.S. patent application Ser. No. 12/620,490, entitled "Systems and Methods for Assembling Lightweight RF Antenna Structures", the entire content of which is incorporated herein by reference. In many embodiments, the novel bonding method produces a lightweight robust RF antenna structure that can used in radar and communication systems.

In order to deliver RF signals to active elements of a radiating long slot aperture of an L1 feed, an RF matched interconnect can be made between the radiating slot structure and the L2 RF feed. In the case of a lightweight antenna, the interconnect is preferably electrically sound as well as structurally sound. A process for electrically and physically interconnecting L1 and L2 feeds is described in co-pending U.S. patent application Ser. No. 12/534,077, entitled "Multi-Layer Microwave Corrugated Printed Circuit Board and Method", the entire content of which is incorporated herein by reference.

On the outside of the top and bottom covers of the L2 assembly, digital control signals and power distribution lines can be routed. The traces and plating on the layers can be copper. However, in order to meet more strict weight requirements, the plating can also be replaced with aluminum. Similar traces and plating materials can be used for the L1 feed assembly.

The Level 1 feed assembly is mounted on top of the Level 2 assembly, and together they form the RF antenna array structure. In one embodiment, the Level 1 feed is approximately 7.8 mm tall, the Level 2 feed is approximately 1.4 mm tall, and therefore the entire assembly is approximately 9.2 mm tall (not including support electronics placed on the Level 2 assembly or any mounting standoffs). Each array panel of the RF antenna can be approximately 0.945 m×1.289 m, or an area of 1.218 m$^2$. In several embodiments, each panel is electrically and mechanically independent from other panels.

Support electronics for an active array antenna, such as the beam steering computer (BSC) and the power control modules (PCMs) can be attached to the back side of the Level 2 Feed assembly. Communication in and out of the panels can be provided by a set of fiber optic cables. The fiber enables communication with electronics located off the antenna structure, and the opto-electronics mounted on the backside of the Level 2 feed.

Figure 3:
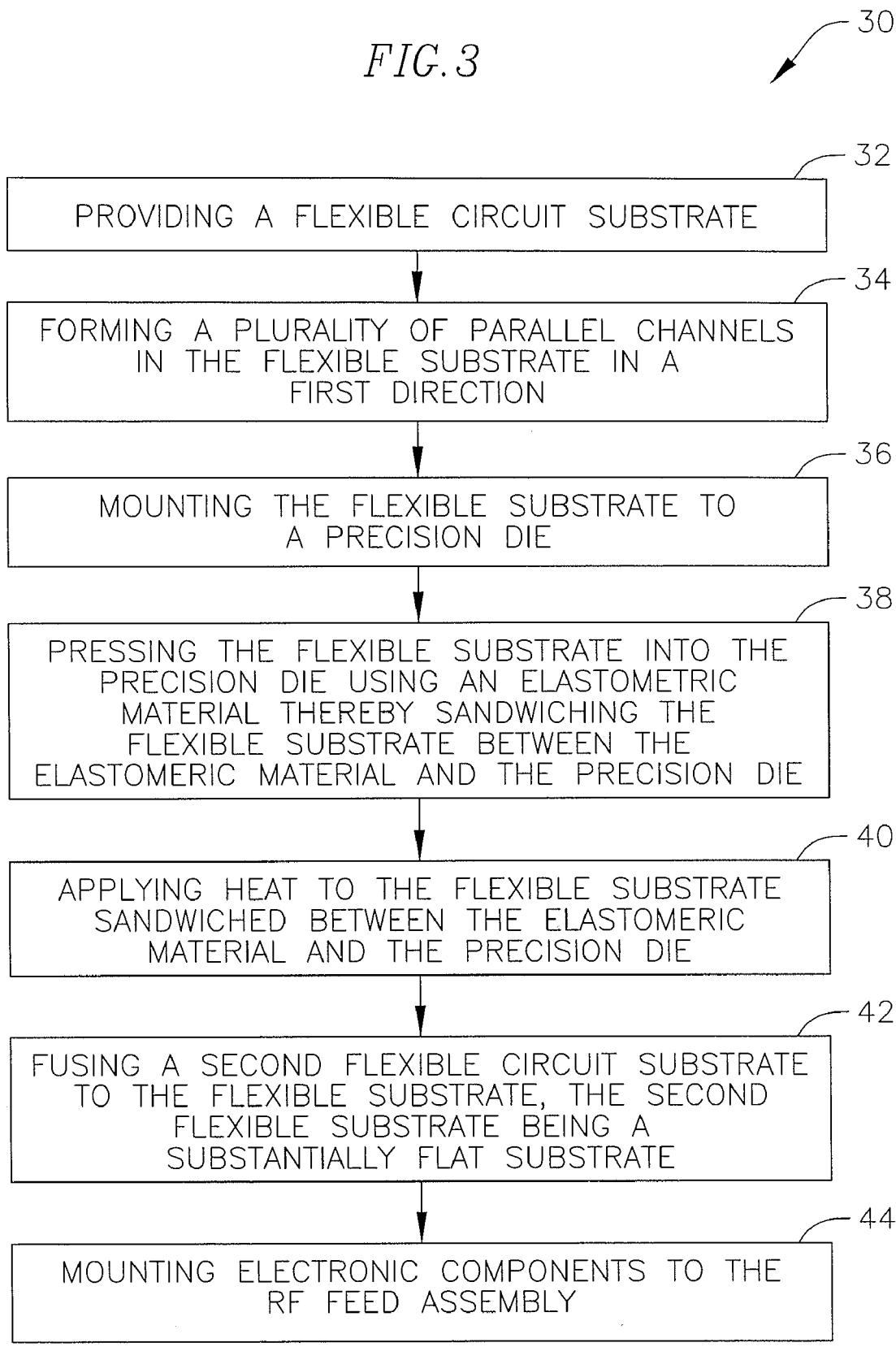
FIG. 3 is a flow chart illustrating a process for precisely forming a level one RF feed assembly in accordance with one embodiment of the invention.

FIG. 3 is a flow chart illustrating a process 30 for precisely forming a level one RF feed assembly in accordance with one embodiment of the invention. The process 30 begins by providing (32) a flexible circuit substrate. In several embodiments, the substrate is an LCP material having copper cladding on both surfaces, either of which may include etched circuitry. In a number of embodiments, the LCP material can have a half ounce copper cladding from a particular LCP manufacturer. However, to reduce weight, the LCP material can undergo a process where the half ounce copper cladding is removed and a quarter ounce copper cladding is attached. In several embodiments, the LCP material used has quarter ounce copper cladding. In another embodiment, the LCP material is aluminum plated.

The process continues by forming (34) a plurality of parallel channels (e.g., folds or formed sections) in the flexible substrate along a first direction. In a number of embodiments, a two-stage press machine is used to form the channels in the flexible substrate. The process can then mount (36) the flexible substrate to a precision die tool. The process can press (38) the flexible substrate into the precision die using an elastomeric material thereby sandwiching the flexible substrate between the elastomeric material and the precision die. In several embodiments, the elastomeric material is silicone. The process can apply heat (40) to the flexible substrate sandwiched between the heat resistant elastomeric material and the precision die. The process can fuse (42) a second flexible circuit substrate to the folded flexible substrate, the second flexible substrate being a substantially flat substrate. In such case, the parallel channels are made tubular to form long slot radiators configured to radiate RF signals. The process can mount (44) electronic components to the RF feed assembly.

In one embodiment, the process can perform the sequence of actions in any order. In another embodiment, the process can skip one or more of the actions. In other embodiments, one of more of the actions are performed simultaneously. In some embodiments, additional actions can be performed.

In a number of embodiments, the forming (34) a plurality of parallel channels in the flexible substrate includes heating an elongated section of the flexible substrate by dispensing heat from a number of holes disposed along a elongated wedge of the press machine. In such case, the forming (34) a plurality of parallel channels in the flexible substrate further includes pressing with the elongated wedge on the flexible substrate, in a direction formal to a surface of the flexible substrate, at a preselected position along the flexible substrate, where a channel shaped receptacle is positioned below the flexible substrate and aligned to receive the flexible substrate and the elongated wedge.

Figure 4:
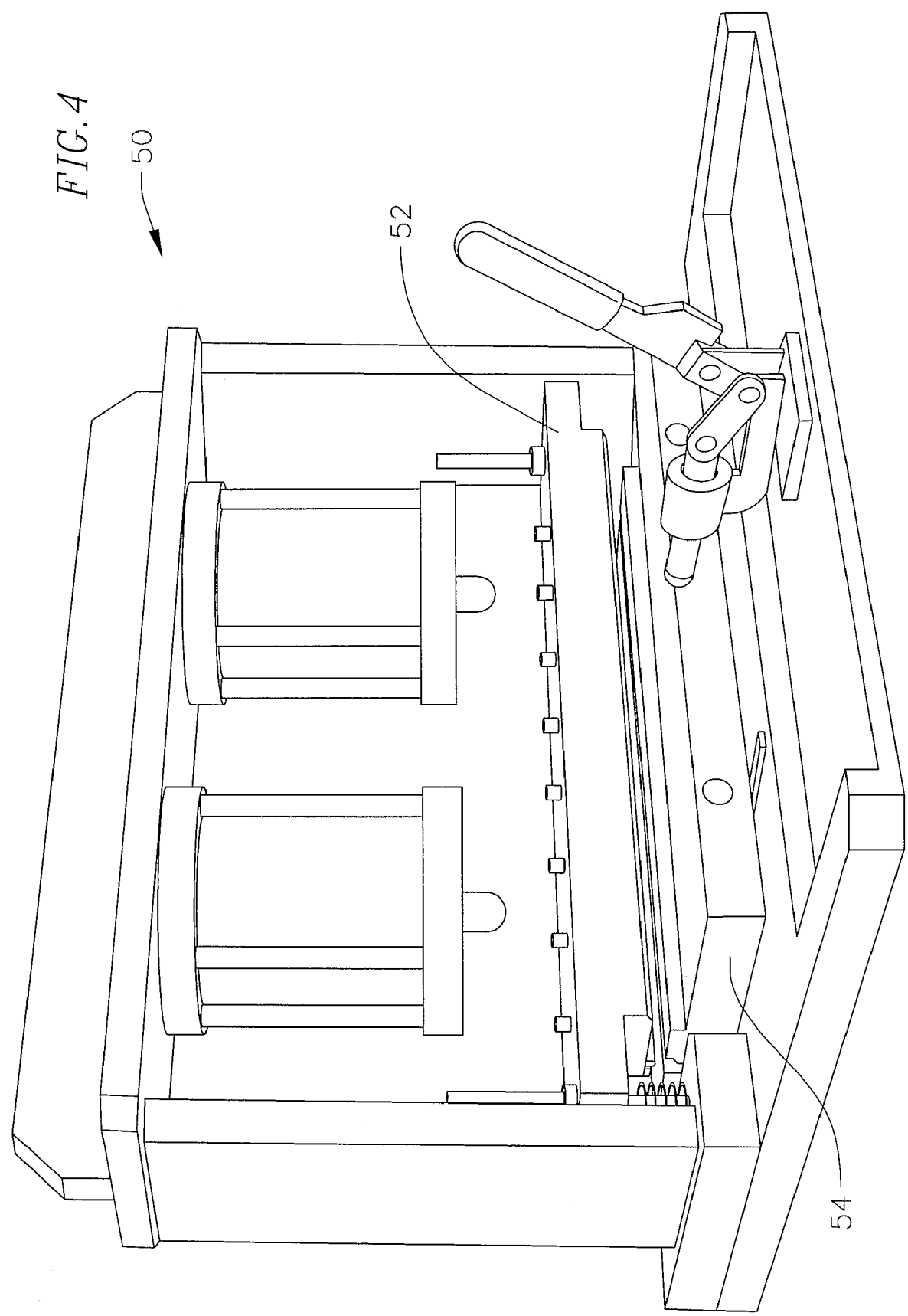
FIG. 4 is a front perspective view of a two-stage press machine having a vertical press assembly and a lateral press assembly for forming elongated channels in a flexible circuit substrate in accordance with one embodiment of the invention.

FIG. 4 is a front perspective view of a two-stage press machine 50 having a vertical press assembly 52 and a lateral press assembly 54 for forming elongated channels in a flexible circuit substrate in accordance with one embodiment of the invention. In some embodiments, the vertical press assembly is a pneumatic device for repeatedly supplying adequate pressure for forming the elongated channels.

Figure 5:
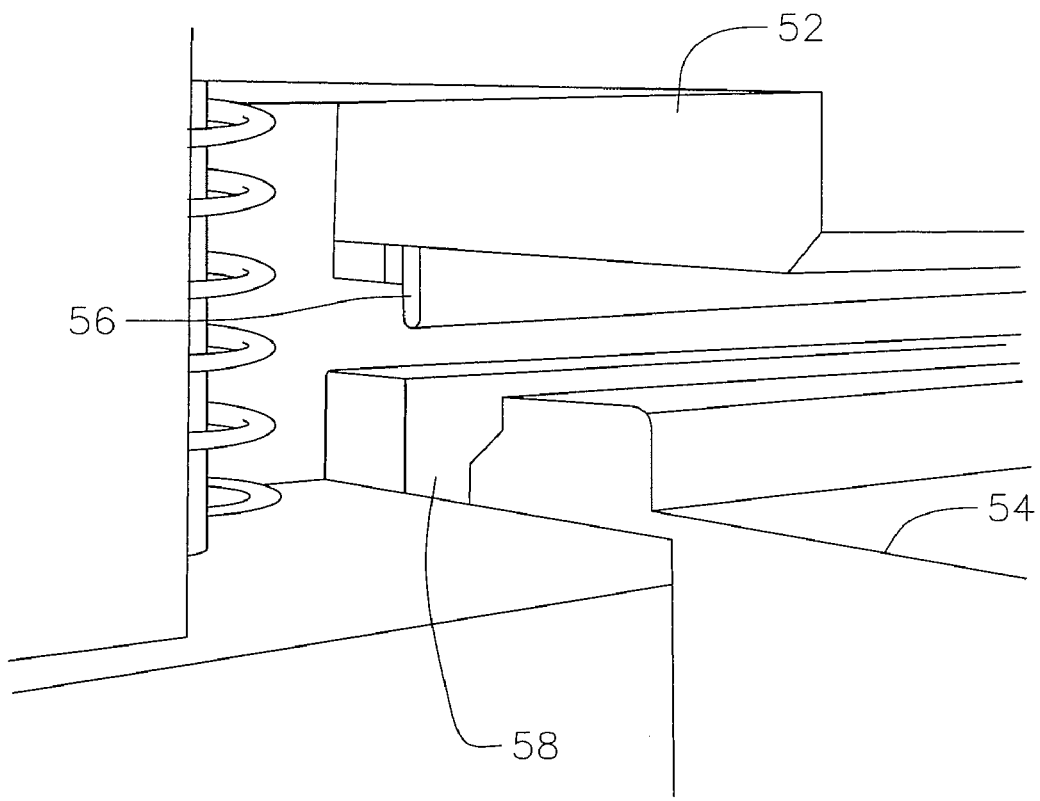
FIG. 5 is a front perspective expanded view of a portion of the two-stage press machine of FIG. 4 showing the lateral press in a retracted position.

FIG. 5 is a front perspective expanded view of a portion of the two-stage press machine 50 of FIG. 4 showing the lateral press 54 in a retracted position. The vertical press assembly 52 includes a channel forming wedge 56 aligned to extend into a channel forming receptacle 58. In the embodiment illustrated in FIG. 5, the receptacle 58 is in the expanded position as one wall of the receptacle 58 is controlled by the lateral press 54. In some embodiments, the channel forming wedge 56 includes a number of holes for dispensing heated gas supplied by a hot gas supply apparatus (not shown) which is coupled to the press machine 50. The hot gas supply apparatus can provide heated gas, such as air, through the holes to heat the flexible substrate. The heated gas can be applied to the substrate before the channel forming wedge 56 is applied to the substrate and/or during the time the channel forming wedge 56 is applied to the substrate. The heated gas can make the flexible substrate more malleable in order to take the shape of the receptacle as it is pressed into the receptacle.

Figure 6:
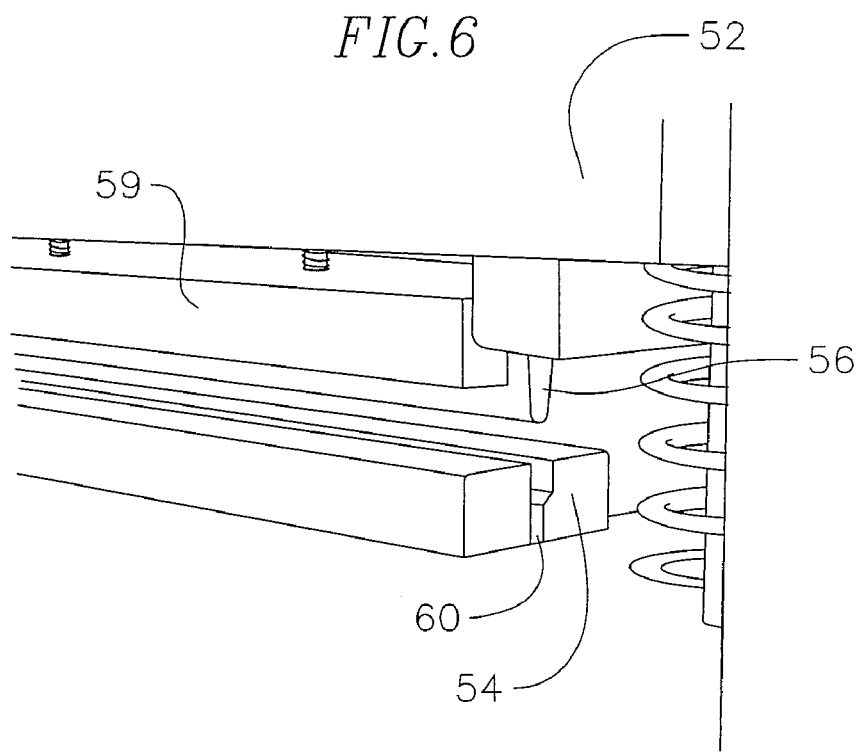
FIG. 6 is a rear perspective expanded view of a portion of the two-stage press machine of FIG. 4 showing the lateral press in a extended position.

FIG. 6 is a rear perspective expanded view of a portion of the two-stage press machine 50 of FIG. 4 showing the lateral press 54 in an extended position. In the extended position, the width of the channel forming receptacle 60 is smaller than when the lateral press 54 is in the retracted position (FIG. 5).

In operation, a flexible substrate can be fed into the machine from the rear and mounted using alignment pins (not shown). The lateral press assembly 54 can begin in the retracted position so as to minimize stretching and trauma to the flexible substrate for a first fold. The channel forming wedge 56 of the vertical press 52 can be lowered into the receptacle 58 thereby folding the flexible substrate along a line at one point on the substrate creating a first fold. The vertical press 52 further includes a securing beam 59 mounted along the channel wedge 56. The securing beam 59 includes a flat bottom surface having a thin sheet/pad of elastomeric material (not shown) such as silicone disposed along the bottom surface. The securing beam 59 and silicone pad can act to securely grip the flexible substrate as the channel wedge 56 makes contact with the flexible substrate. In a number of embodiments, the silicone pad can prevent stretching and slipping of the flexible substrate during the forming process.

Once the first fold is made, the lateral press 54 can then be extended thereby accurately folding the flexible substrate at a second point to form an elongated channel in the substrate. The flexible substrate can be inserted further into the machine 50 at a preselected distance and the process repeated to form multiple elongated channels in the substrate that can be evenly spaced. In many embodiments, parallel channels are formed across an entire length of the substrate in one direction. The use of this more gentle folding operation prior to thermally setting the circuit in the desired shape is helpful in creating a robust and accurate L1 antenna component. In other embodiments, the forming is performed in conjunction with heat provided from numerous holes in the channel wedge. In such case, precise forming of the flexible substrate can be accomplished in absence of any subsequent thermal or die setting processes.

Figure 7:
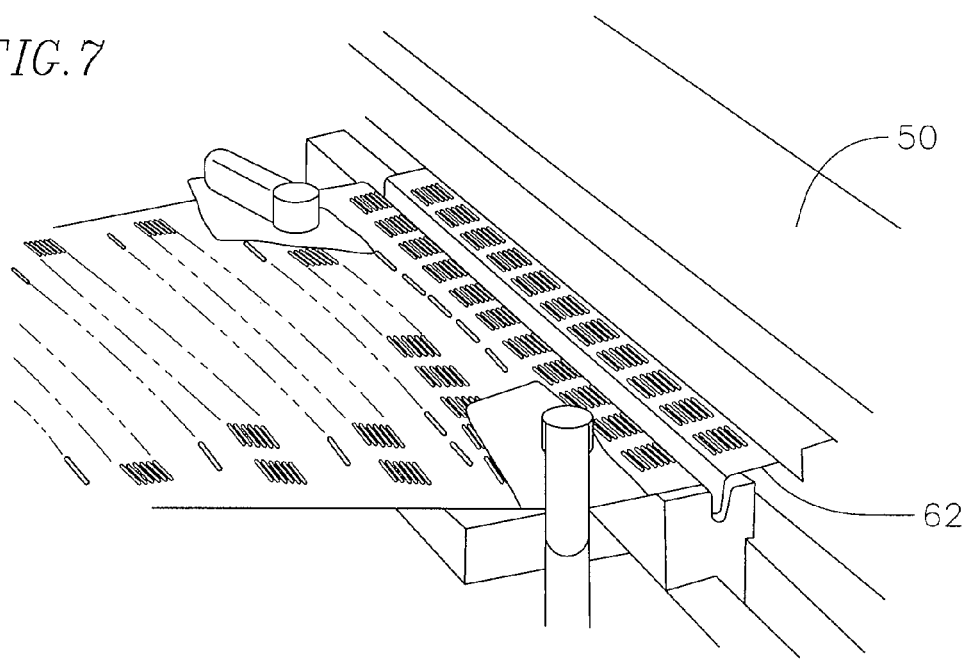
FIG. 7 is a rear perspective view of the two-stage press machine of FIG. 4 operating on a flexible circuit substrate in accordance with one embodiment of the invention.

FIG. 7 is a rear perspective view of the two-stage press machine 50 of FIG. 4 operating on a flexible circuit substrate 62 in accordance with one embodiment of the invention. The machine 50 includes alignment fasteners that are attached to the flexible substrate 62 to maintain precise spacing for the channels being formed in the substrate.

Figure 8:
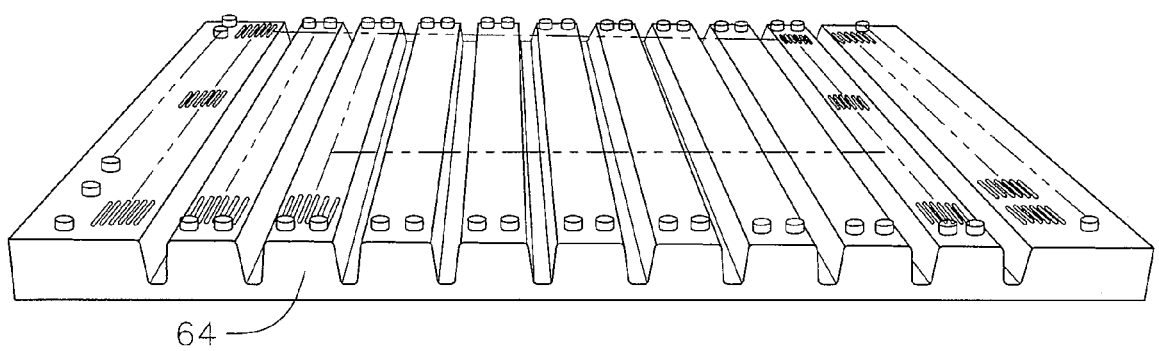
FIG. 8 is a front perspective view of a precision die for precisely shaping a folded flexible circuit substrate in accordance with one embodiment of the invention.

FIG. 8 is a front perspective view of a precision die 64 for precisely shaping a folded flexible circuit substrate in accordance with one embodiment of the invention. In operation, the folded flexible substrate is mounted to the die, and a silicone backer plate (not shown) is mounted on top of the folded flexible substrate to apply constant pressure to the substrate thereby forcing the substrate to adopt the precision shape of the die. In furtherance of this goal, the entire sandwiched assembly is heated at a preselected temperature for a preselected duration.

Once removed from the heating press, the silicone backing sheet is removed, and a flat face sheet (e.g., second flat sheet of LCP) is bonded to the circuit. The face sheet has holes which provide proper alignment using pins. The assembly is removed from the molding tool and placed onto a soldering and shipping tool. This tool ensures the circuit stays flat during the chip installation process. The chips can be placed using a state-of-the art pick and place machine. The chips can then be reflowed in a conveyorized, multistage reflow oven. An epoxy based underfill material is then dispensed adjacent to each chip and allowed to wick under the die through capillary action to provide structural support to the solder joints during handling or thermal excursions. The flexible substrate is thereby precisely formed into a L1 assembly which is capable of providing suitable RF performance characteristics when assembled with the other antenna components.

Figure 9:
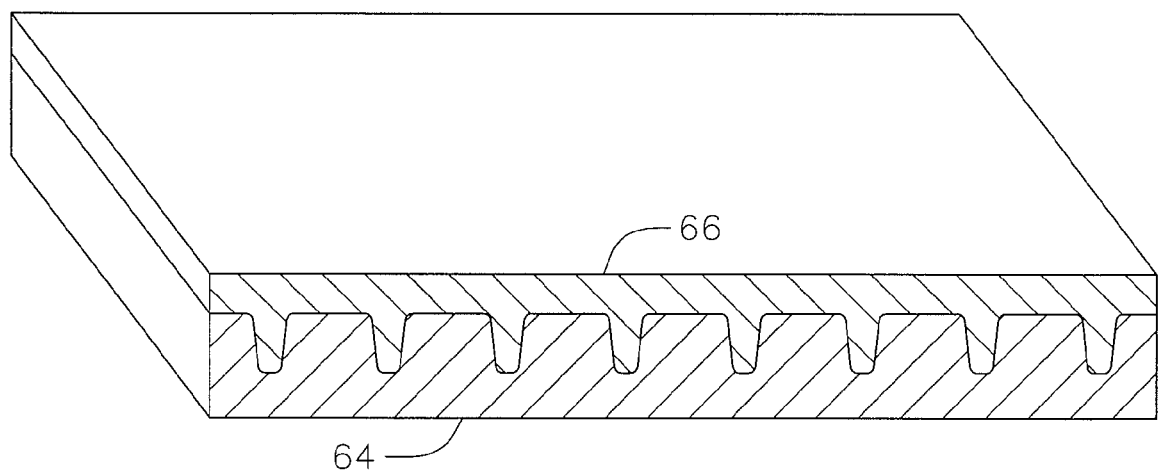
FIG. 9 is a perspective sectional view of a silicone backer plate and the precision die of FIG. 8 in accordance with one embodiment of the invention.

FIG. 9 is a perspective sectional view of a silicone backer plate 66 and the precision die 64 of FIG. 8 in accordance with one embodiment of the invention.

Figure 10:
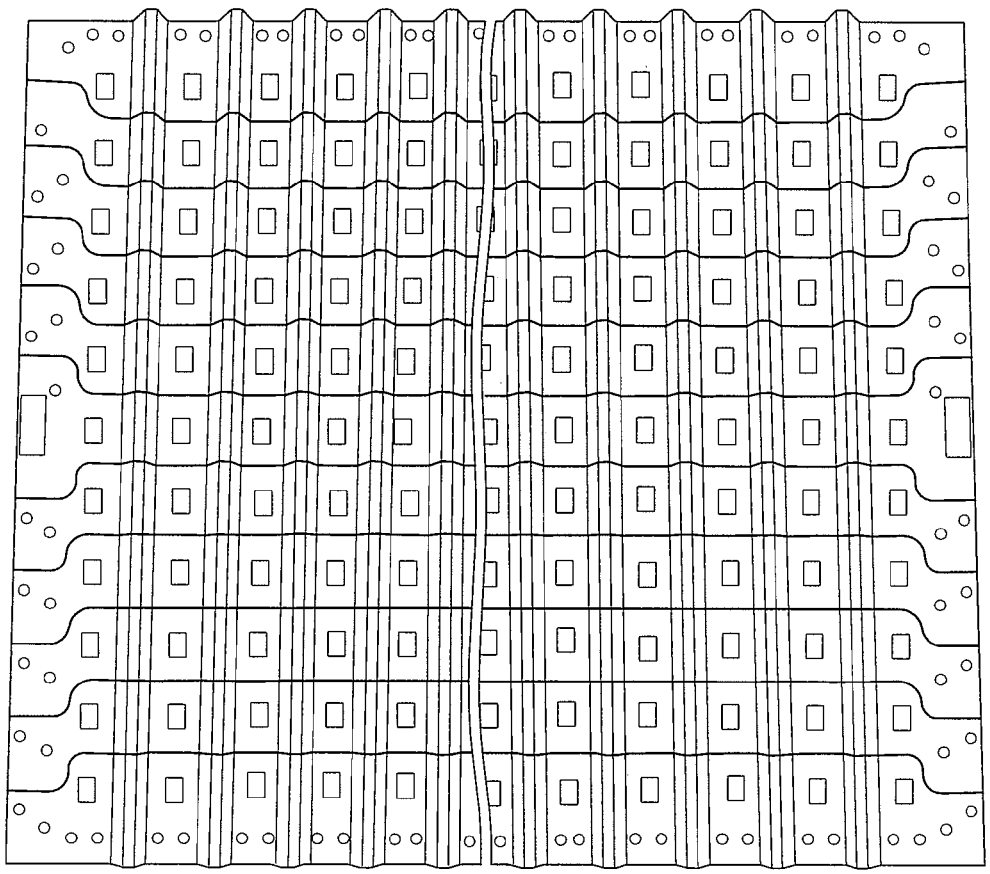
FIG. 10 is a top view of a precisely formed flexible circuit substrate in accordance with one embodiment of the invention.

FIG. 10 is a top view of a precisely formed flexible circuit substrate in accordance with one embodiment of the invention.

Figure 11:
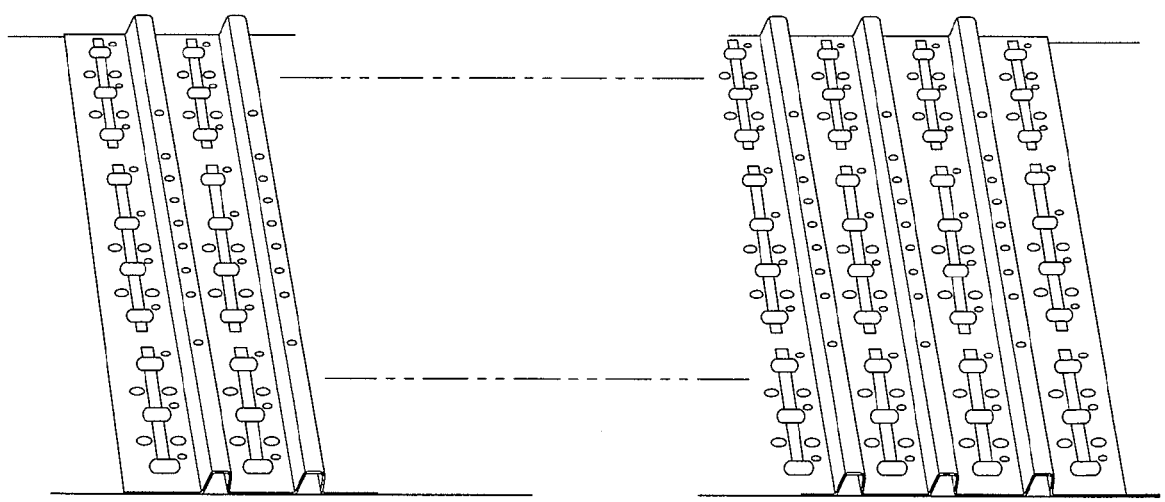
FIG. 11 is a front perspective view of a precisely formed flexible circuit substrate having electrical components mounted thereon in accordance with one embodiment of the invention.

FIG. 11 is a front perspective view of a precisely formed flexible circuit substrate having electrical components mounted thereon in accordance with one embodiment of the invention.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A process for precisely fabricating a radio frequency (RF) antenna structure, the process comprising:
   providing a flexible circuit substrate;
   forming a plurality of parallel channels in the flexible circuit substrate in a first direction;
   mounting the flexible substrate to a precision die;
   pressing the flexible substrate into the precision die using an elastomeric material thereby sandwiching the flexible substrate between the elastomeric material and the precision die; and
   applying heat to the flexible substrate sandwiched between the elastomeric material and the precision die.

2. The process of claim 1 further comprising:
   fusing a second flexible circuit substrate to the flexible substrate, the second flexible substrate being a substantially flat substrate.

3. The process of claim 2 further comprising:
   mounting at least one electronic component to the flexible substrate.

4. The process of claim 3, wherein the at least on one electronic component comprises transmit/receive circuitry.

5. The process of claim 1, wherein the flexible substrate comprises a liquid crystal polymer (LCP) material.

6. The process of claim 1, wherein the elastomeric material comprises silicone.

7. The process of claim 6, wherein the silicone is in the form of a backer plate shaped to precisely mate with the die.

8. The process of claim 7, wherein the die comprises a matching number of channels as the plurality of channels in the flexible substrate.

9. The process of claim 1, wherein the providing a flexible circuit substrate comprises:
   providing a flexible circuit substrate with copper cladding of a first weight;
   modifying the flexible circuit substrate to have a copper cladding of a second weight;
   wherein the second weight is less than the first weight.

10. The process of claim 9, wherein the first weight is 0.5 ounces and the second weight is 0.25 ounces.

11. The process of claim 1, wherein the providing a flexible circuit substrate comprises aluminum plating.

12. The process of claim 1, wherein the forming a plurality of parallel channels in the flexible circuit substrate in a first direction comprises, for each of the plurality of channels:
   pressing with an elongated wedge on the flexible substrate, in a direction normal to a surface of the flexible substrate, at a preselected position on the substrate, wherein a channel shaped receptacle is positioned below the surface of the flexible substrate and aligned to substantially receive the flexible substrate and the elongated wedge;
   pressing with an extendable side of the receptacle, in a lateral direction, on the flexible substrate.

13. The process of claim 12, wherein the pressing with the elongated wedge is performed with a pneumatic pressing assembly.

* * * * *